(12) United States Patent
Chien (10) Patent No.: US 7,871,884 B2
(45) Date of Patent: Jan. 18, 2011

(54) MANUFACTURING METHOD OF DYNAMIC RANDOM ACCESS MEMORY (75) Inventor: Jung-Wu Chien, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 359 days.

(21) Appl. No.: 12/195,365

(22) Filed: Aug. 20, 2008

(65) Prior Publication Data

US 2008/0305592 A1 Dec. 11, 2008

Related U.S. Application Data (62) Division of application No. 11/164,060, filed on Nov. 9, 2005, now Pat. No. 7,435,645.

(30) Foreign Application Priority Data

Oct. 12, 2005 (TW) .............................. 94135480 A (51) Int. Cl.
*H01L 21/8242* (2006.01)
(52) U.S. Cl. ................ 438/243; 438/238; 257/E21.647
(58) Field of Classification Search ................ 438/238, 438/243, 257, 381, 637, 734, 735; 257/E21.647
See application file for complete search history.

(56) References Cited

U.S. PATENT DOCUMENTS

| 6,265,279 | B1 * | 7/2001 | Radens et al. | 438/386 |
| 7,098,102 | B2 * | 8/2006 | Lee et al. | 438/243 |
| 7,276,751 | B2 * | 10/2007 | Ho et al. | 257/296 |
| 7,276,753 | B2 * | 10/2007 | Wu | 257/301 |

* cited by examiner

*Primary Examiner*—Phuc T Dang
(74) *Attorney, Agent, or Firm*—Jianq Chyun IP Office (57) ABSTRACT

A method for manufacturing the DRAM includes first providing a substrate where patterned first mask layer and deep trenches exposed by the patterned first mask layer are formed. Deep trench capacitors are formed in the deep trenches and each of the deep trench capacitors includes a lower electrode, an upper electrode, and a capacitor dielectric layer. A device isolation layer is formed in the first mask layer and the substrate for defining an active region. The first mask layer is removed for exposing the substrate, and a semiconductor layer is formed on the exposed substrate. The semiconductor layer and the substrate are patterned for forming trenches, and the bottom of the trench is adjacent to the upper electrodes of the trench capacitor. Gate structures filling into the trenches are formed on the substrate. A doped region is formed in the substrate adjacent to a side of the gate structure.

8 Claims, 7 Drawing Sheets

MANUFACTURING METHOD OF DYNAMIC RANDOM ACCESS MEMORY

CROSS-REFERENCE TO RELATED APPLICATION

This application is a divisional of an application Ser. No. 11/164,060, filed on Nov. 9, 2005, now U.S. Pat. No. 7,435,645, which claims the priority benefit of Taiwan application serial no. 94135480, filed on Oct. 12, 2005. The entirety of each of the above-mentioned patent applications is hereby incorporated by reference herein and made a part of this specification

BACKGROUND OF THE INVENTION

1. Field of Invention

The present invention relates to a semiconductor device and a manufacturing method thereof, and particularly to a dynamic random access memory (DRAM) and a method for manufacturing the same.

2. Description of the Related Art

Along with the modern microprocessors got surprised advance, its functions have become more marvelous and comprehensive. Accordingly, the modern microprocessors have a tremendous demanding on software to perform a more complex and more massive computation. To meet the demand, the memory process technology has become one of the most important semiconductor industry technologies.

In terms of the data storage type, a memory in general can be categorized into volatile memory (VM) and non-volatile memory (NVM). A DRAM belongs to a volatile memory (VM) and is formed by a plurality of memory cells. Each memory cell herein is formed by an active device and a capacitor, and all memory cells are coupled to one another by a word line (WL) and a bit line (BL).

On the other hand, DRAMs can be, in terms of the capacitor structure thereof, categorized into a DRAM with stacked capacitor and another DRAM with deep trench capacitor. For a DRAM having deep trench capacitor, the deep trench capacitor is formed in a substrate; therefore, in comparison with a DRAM with stacked capacitor, a planarizing process often can be exempt from the regular DRAM process, which allows fabricating a mini-sized memory. As the memory size gets smaller and smaller however, the DRAM having deep trench capacitor encounters numerous problems.

Figure 1A:
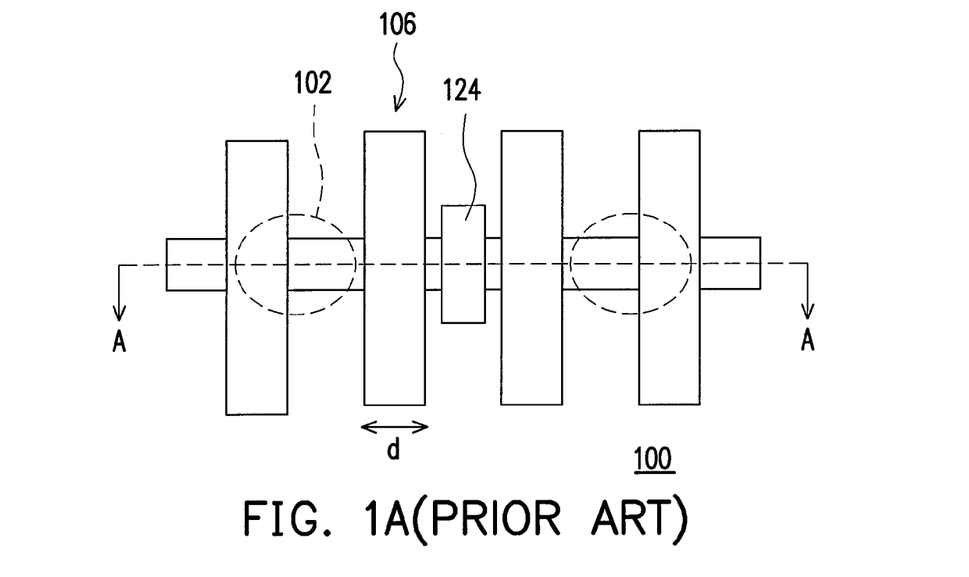
FIG. 1A is a schematic top view of a conventional deep trench DRAM.
Figure 1B:
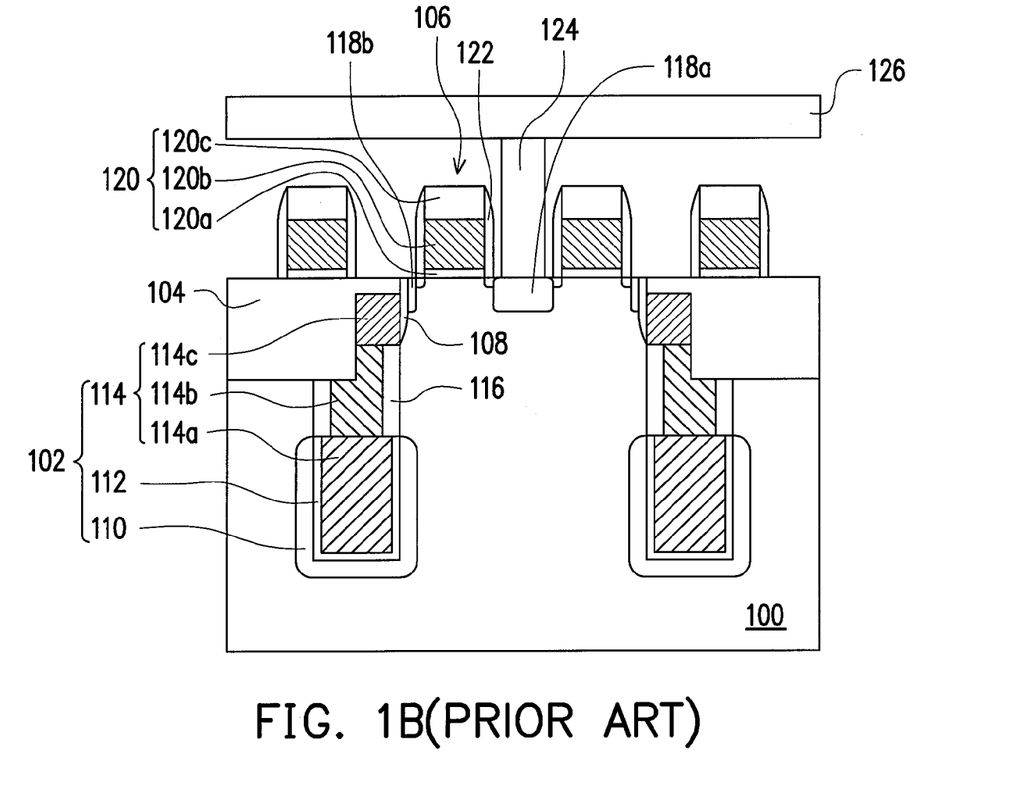
FIG. 1B is a schematic section view of a conventional deep trench DRAM.

FIG. 1A is a schematic top view of a conventional deep trench DRAM. FIG. 1B is a schematic section view of a conventional deep trench DRAM, wherein the section view is made along sectioning plane A-A' in FIG. 1A.

Referring to FIGS. 1 and 2, a DRAM includes a trench capacitor 102, a shallow trench isolation region (STI) 104, an active device 106 and a buried strap 108. The trench capacitor 102 is disposed in a substrate 100 and includes a lower electrode 110, a dielectric layer 112 and an upper electrode 114, wherein the upper electrode 114 is formed by a conductive layer 114a, a conductive layer 114b and a conductive layer 114c. A collar oxide layer 116 is disposed between the conductive layer 114b and the substrate 100. The shallow trench isolation region (STI) 104 is disposed in the substrate, and a part of shallow trench isolation region (STI) 104 is disposed in the trench capacitor 102. The active device 106 is deposed over the substrate 100, includes a source 118a/drain 118b and a gate structure 120. The active device 106 is coupled to the buried strap 108. The gate structure 120 includes a gate dielectric layer 120a, a gate 120b and a cap layer 120c. In addition, the source 118a is coupled to a bit line (BL) 126 through a plug 124. Spacers 122 are disposed at the sidewalls of the gate structure 120.

Since the active device 106 in the above-described DRAM is generally made by using a lithography etching process, the channel region length d of the active device is limited by the lithography etching process and can't be shortened further more so that the device integrity can't be advanced further more. On the other hand, while the channel region length d is shortened, the threshold voltage difference of the active device and so-called short channel effect are occurred. To resolve above-mentioned problem in the prior art, a solution was provided that the dopant density in the active device channel is increased, which however brings on a more unwanted field junction leakage current (FJL current) and degrades the device reliability.

SUMMARY OF THE INVENTION

Based on the above described, the present invention is directed to a DRAM and a manufacturing method thereof, so that the channel length of the active device thereof is not limited by a lithography etching process and the device integrity can be advanced.

The present invention is further directed to a DRAM and a manufacturing method thereof capable of simplifying the process and saving the production cost.

The present invention provides a DRAM, which includes a substrate, an active device and a deep trench capacitor. The substrate has a trench and a deep trench. The active device is disposed on the substrate and includes a gate structure and a doping region. The gate structure is disposed on the substrate and fills into the trench. The doping region is disposed in the substrate at a first side of the gate structure. The deep trench capacitor is disposed in the deep trench, which is disposed in the substrate at a second side of the gate structure. The second side is opposite to the first side and an upper electrode of the deep trench capacitor is adjacent to the bottom of the trench.

In the above described DRAM, the deep trench capacitor includes a lower electrode, the upper electrode and a capacitor dielectric layer. The lower electrode is disposed in the substrate at the bottom of the deep trench. The upper electrode is disposed in the deep trench. The capacitor dielectric layer is disposed on both the sidewall and the bottom of the deep trench.

In the above described DRAM, the upper electrode includes a first conductive layer, a second conductive layer and a third conductive layer. The first conductive layer is disposed on the bottom of the deep trench, the second conductive layer is disposed on the first conductive layer and the third conductive layer is disposed on the second conductive layer and is adjacent to the bottom of the trench.

In the above described DRAM, a collar dielectric layer is included and is disposed on the sidewall of the deep trench on the first conductive layer. The collar dielectric layer further surrounds the second conductive layer and the material of the collar dielectric layer includes silicon oxide.

In the above described DRAM, a buried strap is further included and adjacent to the third conductive layer and the bottom of the trench.

In the above described DRAM, the capacitor dielectric layer is disposed between the first conductive layer and the sidewall and the bottom of the deep trench.

In the above described DRAM, the material of the first conductive layer, the second conductive layer and the third conductive layer includes doped polysilicon.

In the above described DRAM, the gate structure includes a gate and a gate dielectric layer. The gate is disposed on the substrate and fills into the trench. The gate dielectric layer is disposed between the gate and the substrate. The material of the gate dielectric layer includes silicon oxide.

The present invention provides a DRAM, which includes a substrate, two gate structures, a doped region and two deep trench capacitors. The substrate has at least two trenches and two deep trenches and the two trenches are disposed between the two deep trenches. The two gate structures are disposed on the substrate between the two deep trenches and fill into the two trenches respectively. The doped region is disposed in the substrate between the two gates. The two deep trench capacitors are disposed inside the two deep trenches in the substrate, respectively and two upper electrodes of the two deep trench capacitors are adjacent to the bottom of two trenches, respectively.

In the above described DRAM, the deep trench capacitor includes a lower electrode, an upper electrode and a capacitor dielectric layer. The lower electrode is disposed in the substrate under the bottom of the deep trench, the upper electrode is disposed in the deep trench and the capacitor dielectric layer is disposed on the sidewall and the bottom of the deep trench.

In the above described DRAM, the upper electrode includes a first conductive layer, a second conductive layer and a third conductive layer. The first conductive layer is disposed on the bottom of the deep trench, the second conductive layer is disposed on the first conductive layer and the third conductive layer is disposed on the second conductive layer and adjacent to the bottom of the trench.

In the above described DRAM, a collar dielectric layer is further included. The collar dielectric layer is disposed on the sidewall of the deep trench over the first conductive layer and surrounds the second conductive layer. The material of the collar dielectric layer includes silicon oxide.

In the above described DRAM, a buried strap is further included, which is adjacent to the third conductive layer and the bottom of the trench.

In the above described DRAM, the capacitor dielectric layer is disposed between the first conductive layer and the sidewall and the bottom of the deep trench.

In the above described DRAM, the material of the first conductive layer, the second conductive layer and the third conductive layer includes doped polysilicon.

In the above described DRAM, the gate structure includes a gate and a gate dielectric layer. The gate is disposed on the substrate and fills into the trench. The gate dielectric layer is disposed between the gate and the substrate. The material of the gate dielectric layer includes silicon oxide.

In the above described DRAM, since the trench is disposed under the active device, the gate of the active device fills into the trench and the upper electrode of the deep trench capacitor is adjacent to the bottom of the trench so the active device takes the trench sidewall and the region between the doped region and the upper electrode as the channel region thereof (vertical channel region). The channel region of the active device is formed in the substrate at the sidewall of the trench (vertical channel region). Therefore, the width of the active device gate on the substrate is able to be made narrower for increasing the device integrity. Furthermore, the length of the channel region can be precisely controlled by specifying the trench depth so that the problem caused by reducing the device size can be further avoided.

In the above described DRAM, since a part of the gate of the active device is disposed in the trench of the substrate, the channel length of the active device is not limited by the lithography etching process and the device integrity can be advanced. Furthermore, the length of the channel region can be precisely controlled by specifying the trench depth under the active device so that the problem caused by reducing the device size can be further avoided.

The present invention provides a method for manufacturing the DRAM. First, a substrate is provided, wherein a patterned first mask layer is formed on the substrate, deep trenches are formed in the substrate, and the patterned first mask layer exposes the deep trenches. Next, deep trench capacitors are formed in the deep trenches and each of the deep trench capacitors includes a lower electrode, an upper electrode and a capacitor dielectric layer. Afterwards, a device isolation layer is formed in the first mask layer and the substrate for defining an active region. Further, the first mask layer is removed for exposing the substrate and then a semiconductor layer is formed on the exposed substrate. Furthermore, the semiconductor layer and the substrate are patterned for forming trenches and the bottom of the trench is adjacent to the upper electrodes of the trench capacitor. Subsequently, gate structures are formed on the substrate and the gate structure fills into the trench. Finally, a doped region is formed in the substrate adjacent to a side of the gate structure.

In the above described method for manufacturing the DRAM, the material of the semiconductor layer is epitaxy silicon.

In the above described method for manufacturing the DRAM, the steps for forming the deep trench capacitor in the deep trench is as follows. First, a lower electrode is formed in the substrate at the bottom of the deep trench. Next, a capacitor dielectric layer is formed on the surface of the lower electrode, the deep trench bottom is filled with a first conductive layer and the part of capacitor dielectric layer not covered by the first conductive layer is removed. Afterwards, a collar oxide layer is formed on a part of sidewall of the deep trench not covered by the first conductive layer and the deep trench is filled with a second conductive layer for covering the first conductive layer. Further, a part of second conductive layer and collar oxide layer are removed to make the surface of the second conductive layer lower than the substrate surface. Furthermore, a third conductive layer is filled into the deep trench, and the first conductive layer, the second conductive layer and the third conductive layer form an upper electrode hereto.

In the above described method for manufacturing the DRAM, a buried strap is further included and adjacent to the third conductive layer and the trench bottom.

In the above described method for manufacturing the DRAM, the steps for forming a gate structure on the substrate are forming a gate dielectric layer on the substrate first. Then, a conductive layer is formed on the gate dielectric layer, followed by patterning the conductive layer and the gate dielectric layer.

In the above described method for manufacturing the DRAM, it further includes forming spacers on the sidewalls of the gate structure.

In the above described method for manufacturing the DRAM, it further includes forming bit lines (BLs) on the substrate for coupling the doped regions.

In the above described method for manufacturing the DRAM, the steps for patterning the semiconductor layer and the substrate to form the trenches include forming a second mask layer on the substrate first, followed by using the second mask layer and the device isolation structure as a mask to remove a part of semiconductor layer and substrate, and finally removing the second mask layer.

In the above-described method for manufacturing the DRAM, since the device isolation structure is the same high as the mask layer, so that no recess produced with the device isolation structure during removing the mask layer. Further, after forming the device isolation structure, the semiconductor layer is formed by using the epitaxy process and the surface of the semiconductor layer is advanced to a same height as the device isolation structure. Since the device isolation structure is higher than the substrate surface and the channel region is formed in the semiconductor layer, therefore, the device isolation structure under the substrate surface doesn't need to be made too deep, which contributes to a simpler process. Furthermore, the process for forming active device and the process for making the shallow trench isolation structure are integrated, the DRAM process can be further simplified.

In the above described method for manufacturing the DRAM, since the second mask layer and the device isolation structure are used as an alignment mask for forming the trenches, the process window allows to be bigger for an easier process.

In addition, in the above described method for manufacturing the DRAM, since a part of the gate of the active device is disposed in the trench of the substrate, the channel length of the active device is not limited by the lithography etching process and the device integrity can be advanced. Moreover, the length of the channel region can be precisely controlled by specifying the trench depth under the active device, so that the problem caused by reducing the device size can be further avoided.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 2A:
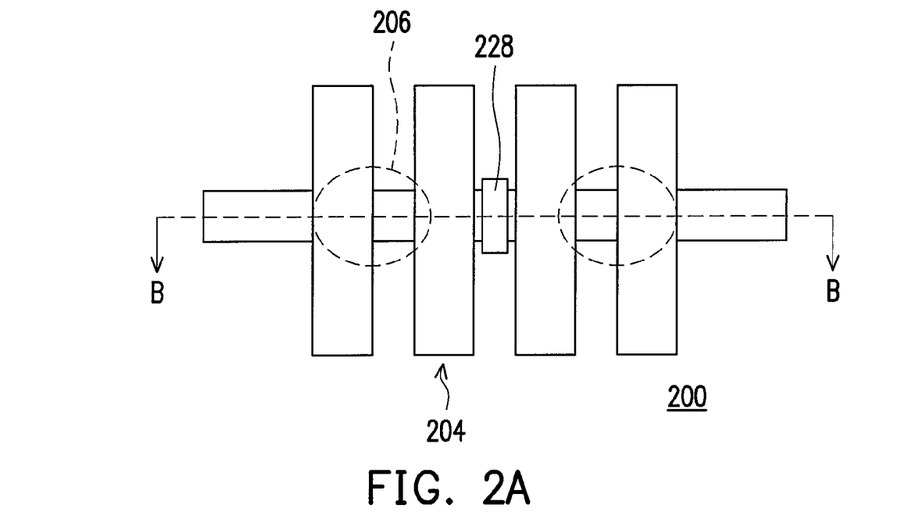
FIG. 2A is a schematic top view of a deep trench DRAM in an embodiment of the present invention.
Figure 2B:
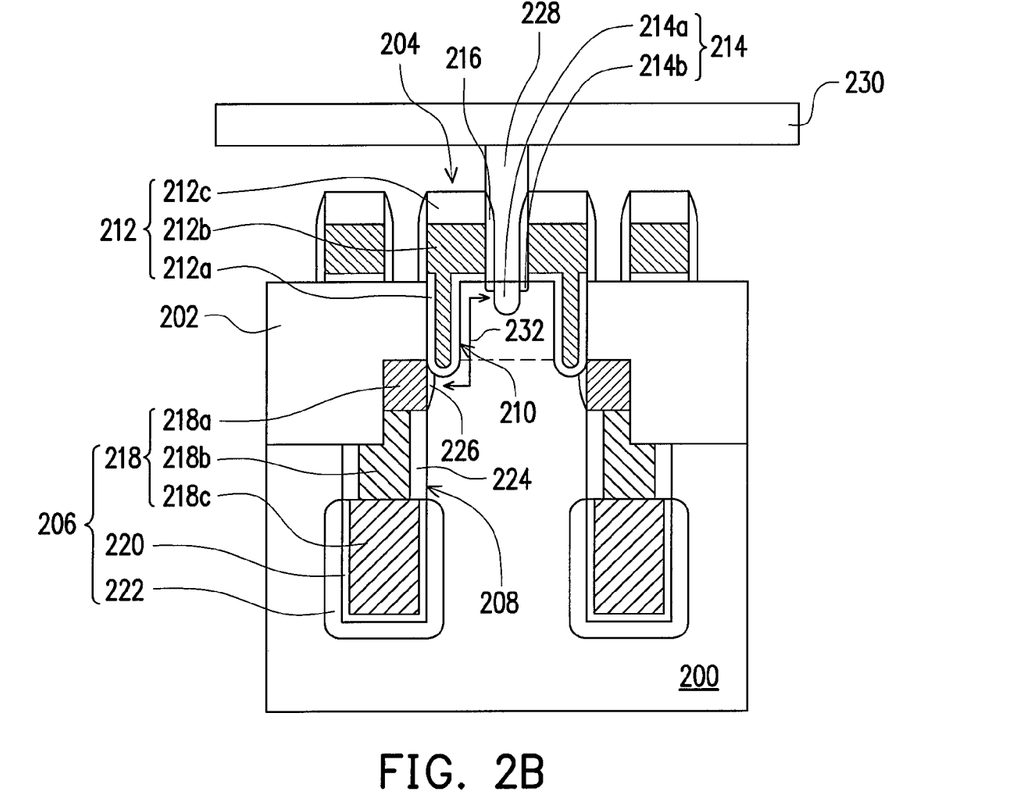
FIG. 2B is a schematic section view of a deep trench DRAM in an embodiment of the present invention.

FIG. 2A is a schematic top view of a deep trench DRAM in an embodiment of the present invention. FIG. 2B is a schematic section view of a deep trench DRAM in an embodiment of the present invention, wherein the schematic section view is made along the sectioning plane B-B' in FIG. 2A.

Referring to FIGS. 2A and 2B, a dynamic random access memory (DRAM) includes a substrate 200, device isolation structures 202, active devices 204 and deep trench capacitors 206.

The substrate 200 is, for example, a silicon substrate. Deep trenches 208 and trenches 210 are disposed in the substrate 200. The depth of the deep trenches 208 is larger than the one of the trenches 210.

The device isolation structure 202 is disposed, for example, on the substrate 200 for defining active regions. The device isolation structure 202 is, for example, a shallow trench isolation structure.

The active device 204 is disposed, for example, on the substrate 200. The active device 204 includes a gate structure 212 and a doped region 214.

The gate structure 212 is formed, for example, by a gate dielectric layer 212a and a gate 212b. The gate 212b is disposed, for example, on the substrate 200 and fills into the trench 210. The material of the gate 212b is, for example, doped polysilicon. The gate dielectric layer 212a is disposed, for example, between the gate 212b and the substrate 200. The material of the gate dielectric layer 212a is, for example, silicon oxide. According to a need, a cap layer 212c can be further disposed on the gate 212b. The material of the cap layer 212c is, for example, silicon oxide or silicon nitride, and so on. According to a practical need, spacers 216 can be furthermore disposed on the sidewalls of the gate structure 212. The material of the spacers 216 includes, for example, silicon oxide or silicon nitride, and so on.

The doped region 214 is disposed, for example, in the substrate 200 at a side of the gate structure 212. The doped region 214 is formed, for example, by a heavy-doped region 214a and a light-doped region 214b. The light-doped region 214b is disposed, for example, in the substrate 200 under the spacers 216. The doped region 214 is, for example, an N-type doped region or a P-type doped region.

The deep trench capacitors 206 is disposed, for example, in the deep trench 208 of the substrate 200 at another side of the gate structure 212. In other word, the deep trench capacitors 206 and the doped region 214 are disposed in the substrate 200 at both sides of the gate structure 212, respectively.

The deep trench capacitors 206 is formed, for example, by an upper electrode 218, a capacitor dielectric layer 220 and a lower electrode 222. The upper electrode 218 is, for example, adjacent to the trench bottom. In the embodiment, the upper electrode 218 is formed, for example, by three conductive layers 218a, 218b and 218c. The conductive layer 218c is disposed, for example, on the bottom of the deep trench 208. The conductive layer 218b is disposed, for example, on the conductive layer 218c. The conductive layer 218a is disposed, for example, on the conductive layer 218b and is adjacent to the bottom of the trench 210. The material of the conductive layers 218a, 218b and 218c is, for example, doped polysilicon.

The lower electrode 222 of the deep trench capacitors 206 is disposed, for example, on the bottom of the deep trench 208 in the substrate 200. The lower electrode 222 is, for example, a doped region. The capacitor dielectric layer 220 is disposed, for example, between the conductive layer 218c and the lower electrode 222 (in the substrate 200). A collar dielectric layer 224 is disposed, for example, between the conductive layer 218b and the substrate 200. The material of the collar dielectric layer 224 is, for example, silicon oxide.

Besides, a buried strap 226 is further disposed in the substrate 200, for example. The buried strap 226 is adjacent to the conductive layer 218a and the bottom of the trench 210. In the substrate, a bit line (BL) 230 is, for example, disposed, and the doped region 214 is coupled to the bit line (BL) 230 through a plug 228.

In the above described DRAM, since the trench 210 is disposed under the active device 204, the gate 212b of the active device 204 fills into the trench 210 and the upper electrode 218 of the deep trench capacitor 206 is adjacent to the bottom of the trench 210, so the active device 204 takes the sidewall of the trench 210 and the substrate 200 between the doped region 214 and the upper electrode 218 as the channel region 232 thereof (vertical channel region). The channel region of the active device 204 is formed in the substrate 200 at the sidewall of the trench (vertical channel region). Therefore, the width of the gate of the active device 204 on the substrate 200 is able to be made narrower for increasing the device integrity. Furthermore, the length of the channel region 232 can be precisely controlled by specifying the depth of the trench 210, so that the problem caused by reducing the device size can be further avoided.

In the embodiment of the present invention, the upper electrode of the deep trench capacitor is formed by three conductive layers 218a, 218b and 218c, which is considered as exemplary only. In fact, the upper electrode of the deep trench capacitor can be formed by one conductive layer, or two conductive layers, even more than three conductive layers. In addition, if the part of the active device 204 at the bottom of the trench 210 is directly coupled to the upper electrode 218 of the deep trench capacitor 206, the buried strap 226 is not certainly necessary.

In addition, only a single cell of the deep trench DRAM is explained hereinabove. However, as shown in FIG. 2B, two cells of the deep trench DRAM are usually taken as a set for use, where the two cells are arranged in a mirror symmetry manner. Two trenches 210 are disposed between two deep trenches 208, two active devices 204 are disposed on the substrate 200 between the two deep trenches 208 and fill into the two trenches 210. The doped region 214 is disposed in the substrate 200 between the two active devices 204, which share a doped region 214.

In the DRAM of the present invention, since a part of the active device gate is disposed in the trench of the substrate, the channel length of the active device is determined by the trench depth, not limited by the lithography etching process, therefore the device integrity can be advanced. Furthermore, the length of the channel region can be precisely controlled by specifying the trench depth under the active device, so that the problem caused by reducing the device size can be further avoided.

FIG. 3A~3J are schematic section views showing a process for manufacturing a DRAM memory cell according to an embodiment of the present invention for explaining the manufacturing method thereof.

Figure 3A:
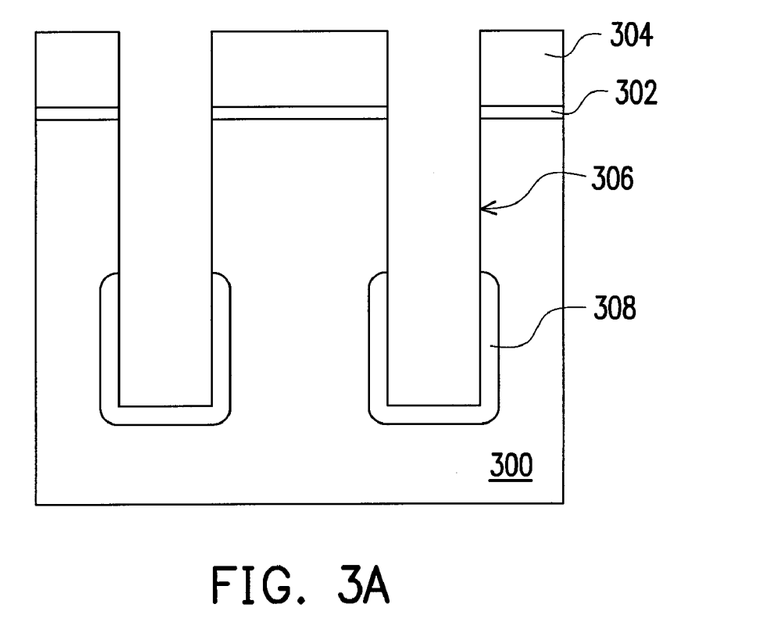
FIG. 3A-3J are schematic section views showing a process for manufacturing a DRAM memory cell according to an embodiment of the present invention.

Referring to FIG. 3A, first, a substrate 300, for example, a silicon substrate is provided. A pad layer 302 is formed on the substrate 300, followed by forming a mask layer 304 on the pad layer 302. The material of the pad layer 302 is, for example, silicon oxide and the pad layer 302 is formed by using, for example, thermal oxidation process. The material of the mask layer 304 is, for example, silicon nitride and the mask layer 304 is formed by using, for example, chemical vapor deposition (CVD).

Next, a lithography process and an etching process are performed to the mask layer 304 and the pad layer 302 for forming patterned mask layer 304 and pad layer 302. Then, taking the patterned mask layer 304 and the pad layer 302 as a mask, an etching process, for example, a dry etching process, is performed to form a deep trench 306 in the substrate 300.

Afterwards, a lower electrode 308 is formed in the substrate 300 at the bottom of the deep trench 306. Wherein, the lower electrode 308 is a doped region and formed by following steps, for example. First, a doped insulation layer is formed on the sidewall at the bottom of the deep trench 306, followed by filling a photoresist layer in the deep trench 306. Then, a part of doped insulation layer that uncovered by the photoresist layer is removed, followed by removing the photoresist layer. After that, an insulation layer is formed conformably to the topography of the doped insulation layer, followed by performing a thermal diffusion process, so that the dopant in the doped insulation layer is diffused into the substrate 300. In the end, the insulation layer and the doped insulation layer are removed. In an embodiment, the lower electrode 308 is, for example, N-type doped. The detail regarding to fabricate the lower electrode 308 should be well known by those skilled in the art and is omitted herein for simplicity.

Figure 3B:
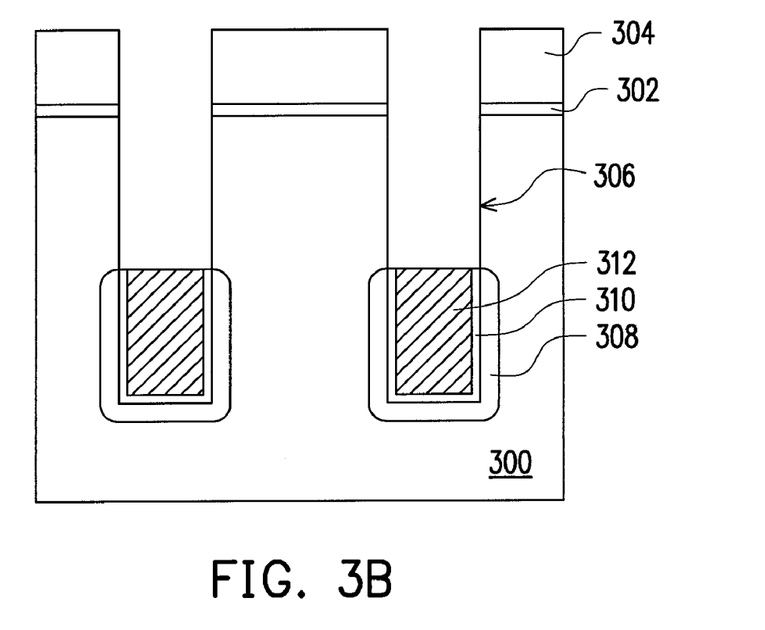

Further, referring to FIG. 3B, a capacitor dielectric layer 310 and a conductive layer 312 are formed at the bottom of the deep trench 306. The method for forming the capacitor dielectric layer 310 and the conductive layer 312 is, for example, explained as follows. At first, a dielectric layer (not shown in the figure) is formed on the substrate 300. The material of the dielectric layer is, for example, silicon oxide, silicon nitride, silicon oxynitride or other appropriate dielectric materials. The method for forming the dielectric layer is, for example, thermal oxidation, chemical vapor deposition (CVD) or other appropriate processes. Second, a conductive layer 312 is formed on the substrate 300 and covers a part of dielectric layer. The material of the conductive layer 312 is, for example, polysilicon, doped polysilicon or other appropriate conductor materials. The method for forming the conductive layer 312 is, for example, with in-situ doping ion manner and by using CVD to form a doped polysilicon layer on the substrate 300, followed by removing the doped polysilicon layer outside the deep trench 306 and a part of doped polysilicon layer on top of the deep trench 306. The method for removing the doped polysilicon layer is, for example, dry etching or wet etching process. Third, the dielectric layer uncovered by the conductive layer 312 is removed for forming the capacitor dielectric layer 310. The method for removing the dielectric layer is, for example, dry etching or wet etching process. The material of the capacitor dielectric layer 310 is, for example, silicon oxide, silicon nitride, silicon oxynitride or other appropriate dielectric materials. The method for forming the capacitor dielectric layer 310 is, for example, thermal oxidation process, CVD or other appropriate processes.

Figure 3C:
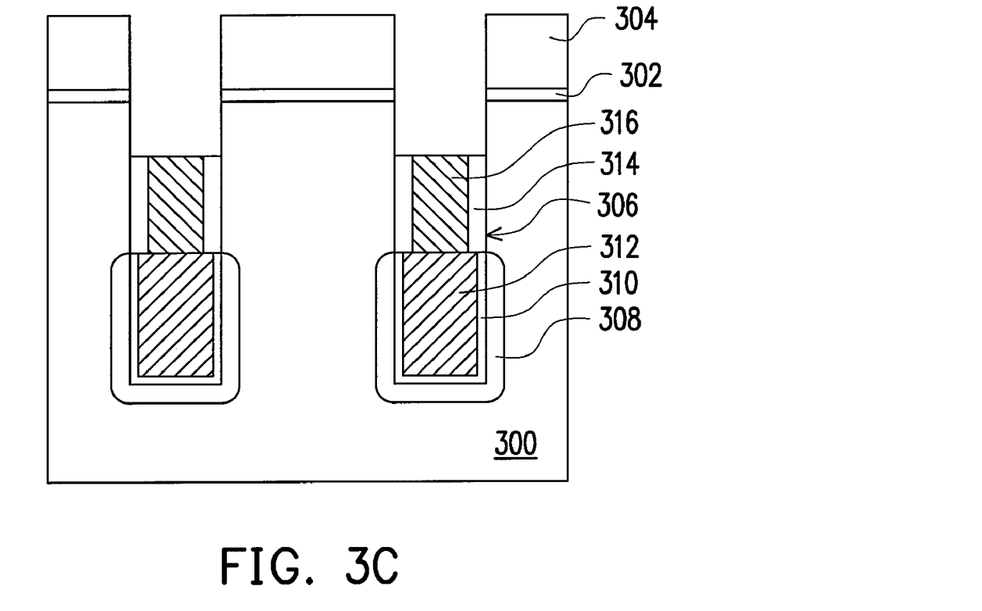

Furthermore referring to FIG. 3C, a collar dielectric layer 314 is formed on the sidewall of the deep trench 306 uncovered by the conductive layer 312. Wherein, the material of the collar dielectric layer 314 is, for example, silicon oxide. The method for forming the collar dielectric layer 314 is, for example, to perform a CVD for forming a collar dielectric material layer conformably to the topography of the sidewall of the deep trench 306, followed by removing the collar dielectric material layer outside the deep trench 306 and a part of the collar dielectric material layer on top of the conductive layer 312. Wherein, the method for removing a part of collar oxide material layer is, for example, anisotropic etching process.

Moreover, a conductive layer 316 is filled into the deep trench 306 and covers the conductive layer 312, wherein the conductive layer 316 is coupled to the conductive layer 312. Then, a part of conductive layer 316 and a part of collar dielectric layer 314 are removed to make the conductive layer 316 and the collar dielectric layer 314 lower than the surface of the substrate 300. The material of the conductive layer 316 and the method for forming the same are similar to the conductive layer 312, so it is omitted for simplicity herein.

Figure 3D:
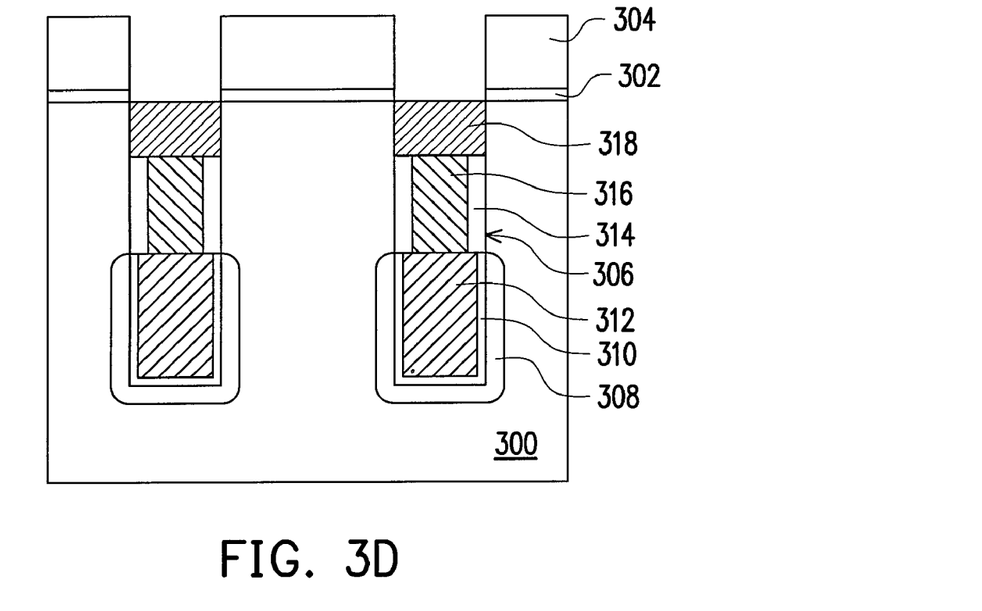

Subsequently referring to FIG. 3D, a conductive layer 318 is filled into the deep trench 306 and covers the conductive layer 314, wherein the conductive layer 318 is coupled to the conductive layer 314. The material of the conductive layer 318 and the method for forming the same are similar to the conductive layer 312, so it is omitted for simplicity herein.

Figure 3E:
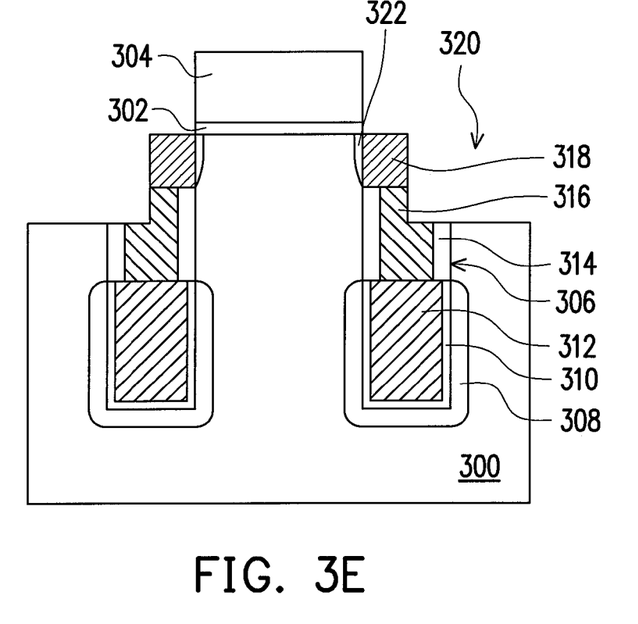

In succession, the process of the active device is described hereinafter. Referring to FIG. 3E, a trench 320 is formed in the substrate 300 at a side of the conductive layer 318. The trench 320 would expose a part of substrate 300 and the conductive layers 316 and 318. Wherein, the method for forming the trench 320 is, for example, etching process. After that, a buried strap 322 can be formed depending on the actual need. The method for forming buried strap 322 is, for example, ion implanting process.

Figure 3F:
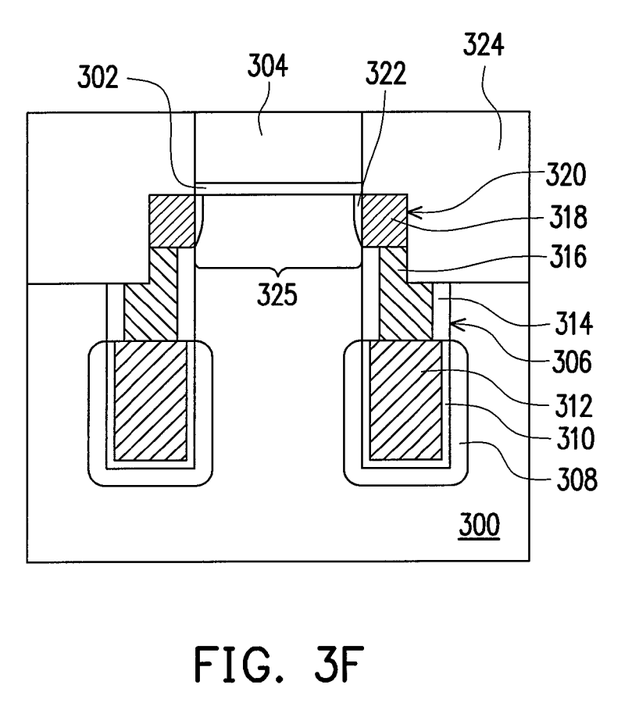

Then referring to FIG. 3F, an insulation material is filled into the trench 320 for forming a device isolation structure 324 and defining an active region 325. The material of the device isolation structure 324 is, for example, silicon oxide or other materials suitable for making channels. The method for forming the device isolation structure 324 is, for example, performing a deposition process to form an insulation material layer filling the trench 320, followed by performing a chemical mechanical polishing (CMP) process or a etching back process to remove the part of insulation material layer outside the trench 320.

Figure 3G:
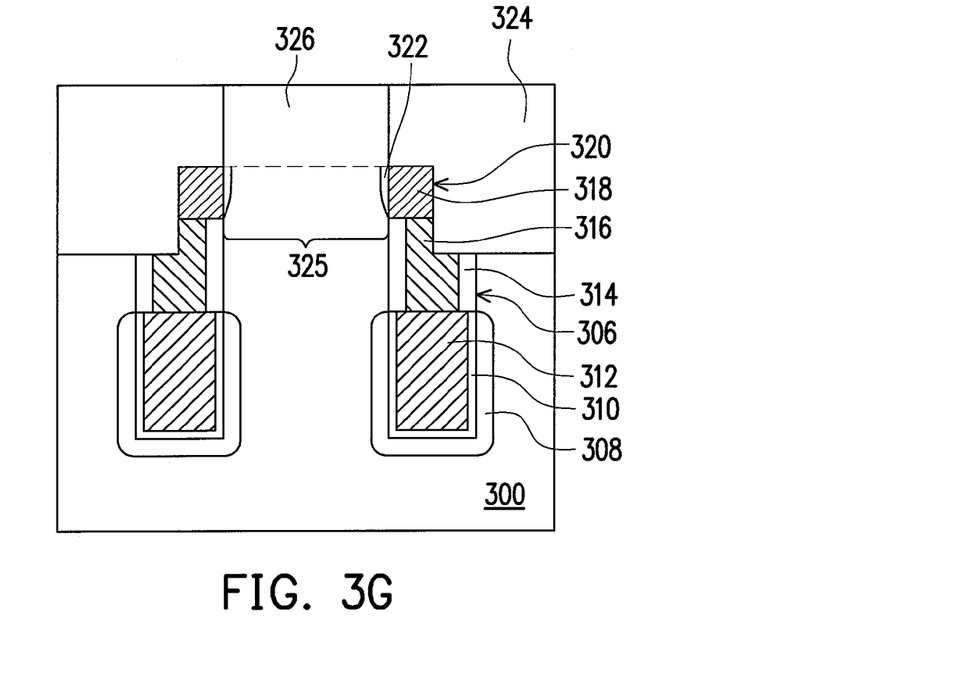

Then referring to FIG. 3G, the mask layer 304 and the pad layer 302 are removed to expose the substrate 300. Then, a semiconductor layer 326 is formed on the substrate 300. The material of the semiconductor layer 326 is, for example, epitaxy silicon. The method for forming the semiconductor layer 326 is, for example, selective epitaxy process, by which the epitaxy silicon would selectively grow on the surface containing silicon and the epitaxy silicon after growth has a same crystal orientation as the silicon material hereunder. Then, a planarization process follows, so that the conductive layer 316 and the device isolation structure 324 have a substantially flat surface.

Figure 3H:
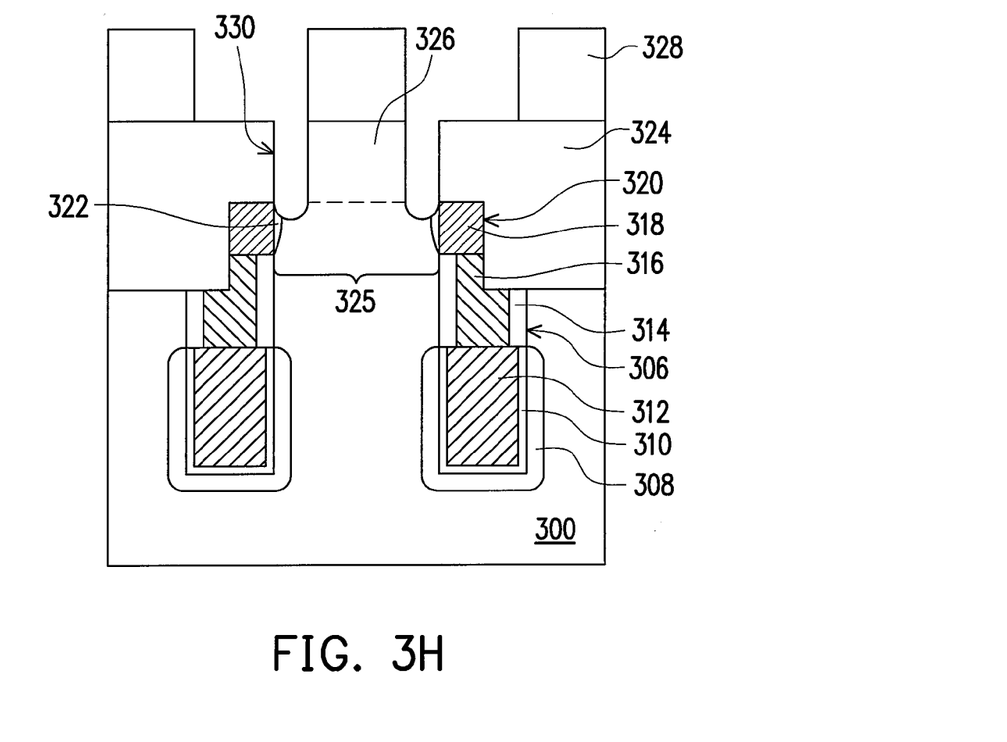

Whereafter referring to FIG. 3H, a mask layer 328 is formed on the substrate 300 to expose a part of semiconductor layer 326. The mask layer 328 is, for example, a patterned photoresist layer. The method for forming mask layer 328 is, for example, forming a photoresist layer, followed by exposing and developing. Then, the mask layer 328 and the device isolation structure 324 are used as a mask to etch the semiconductor layer 326 and the substrate 300 for forming the trench 330. Wherein, the trench 330 at least exposes the buried strap 322. Since the device isolation structure 324 is fabricated prior to forming the trench 330, wherein the mask layer 328 and the device isolation structure 324 are used as an alignment mask, therefore, the pattern of the mask layer 328 on the semiconductor layer 326 has no specific limitation, but needs to cover a part of the active region. For example, the pattern of the mask layer 328 can be long bar-like, circle-like or ellipse-like. A circle-like or ellipse-like mask layer 328 has an advantage to increase the gate width.

Figure 3I:
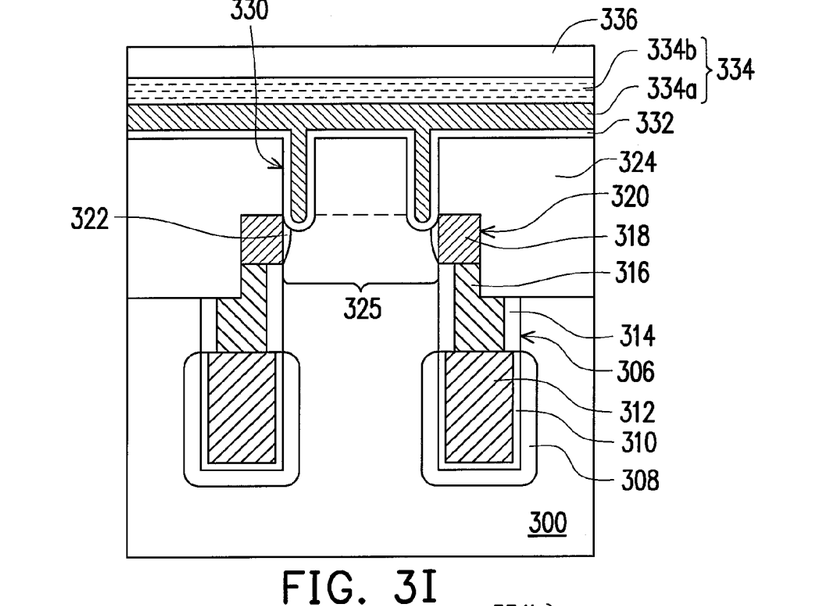

Later referring to FIG. 3I, the mask layer 328 is removed to form a gate dielectric layer 332 on the substrate 300. The gate dielectric layer 332 covers the exposed semiconductor layer 326 and the substrate 300. The material of the gate dielectric layer 332 is, for example, silicon oxide, while the method for forming the gate dielectric layer 332 is, for example, thermal oxidation process or CVD. Then, a conductive layer 334 is formed on the substrate 300. The conductive layer 334 covers and fills into the trench 330. The material of the conductive layer 334 is, for example, polycide which is formed by a doped polysilicon layer 334a and a metal silicide layer 334b. The method for forming the polycide is, for example, forming a doped polysilicon layer by using CVD, followed by depositing the metal silicide on the doped polysilicon layer, where the material of the metal silicide is, for example, tungsten silicide or titanium silicide. Nevertheless, the conductive layer 334 allows to be formed by a single layer of conductor or by over two layers of conductor.

In addition, a cap layer 336 is formed on the conductive layer 334. The material of the cap layer 336 includes insulation materials, for example, silicon nitride or silicon oxide. The method for forming the cap layer 336 is, for example, CVD.

Figure 3J:
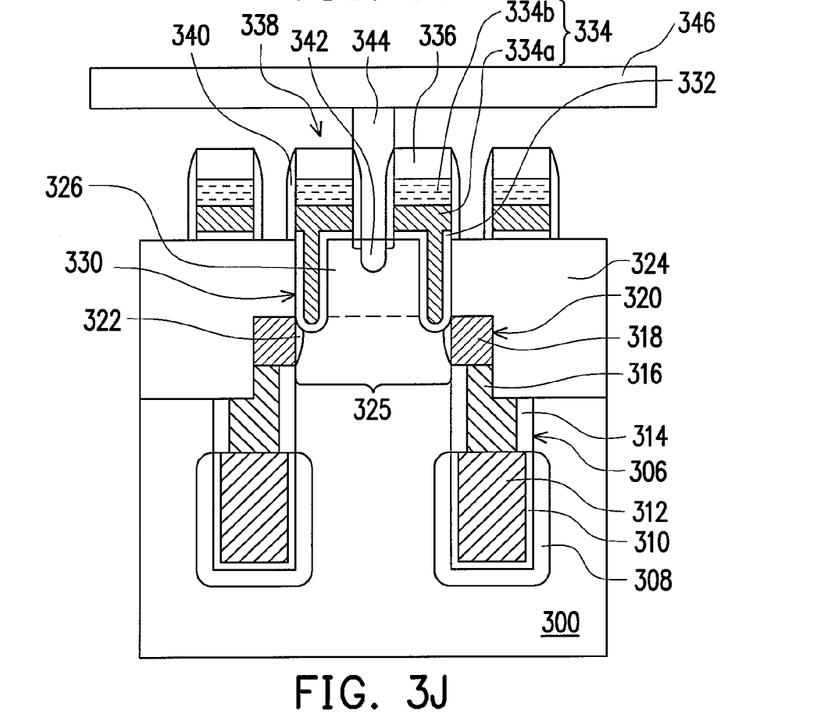

In the end referring to FIG. 3J, the cap layer 336, the conductive layer 334 and the gate dielectric layer 332 are patterned to form a gate structure 338. Then, spacers 340 are formed on the sidewalls of the gate structure 338. The material of the spacers 340 includes, for example, silicon nitride or silicon oxide. The method for forming the spacers 340 is, for example, forming an insulation material layer by using CVD, followed by performing anisotropic etching process. After that, a doped region 342 is formed in the substrate 300 at a side of the gate structure 338. Besides, after forming the doped region 342, it can include a related process for forming interconnect, so that the doped region 342 and the conductive layer 346 (bit-line) is coupled through a plug 344.

In the method for manufacturing the DRAM of the present invention, the three conductive layers (312, 314 and 316) form the upper electrode of the deep trench capacitor, which is considered as exemplary only. In fact, the upper electrode of the deep trench capacitor allows to be formed by a single conductive layer, two conductive layers even more than three conductive layers. Remarkably, the buried strap 322 can be saved from disposing if the part of the active device at the bottom of the trench 330 is directly coupled to the upper electrode 318 of the deep trench capacitor.

Since the device isolation structure 324 is the same high as the mask layer 304 in the method for manufacturing the DRAM of the present invention, it would not produce recess with the device isolation structure 324 during removing the mask layer 304 and the pad layer 302. Further, after forming the device isolation structure 324, the semiconductor layer 326 is formed by using epitaxy process and the surface of the semiconductor layer 326 is advanced to the same height as the isolation structure 324. The device isolation structure 324 is higher than the surface of the substrate 300 and the channel region is formed in the semiconductor layer 326, thus the depth of the device isolation structure under the surface of the substrate 300 is not too deep required, which simplifies the process. Noticeably also, the process for fabricating the active device and the process for fabricating the shallow trench isolation structure are integrated together herein, which further simplifies the process.

In the method for manufacturing the DRAM of the present invention, since the mask layer 328 and the device isolation structure 324 are used as the alignment mask for forming the trench 330, therefore the process window allows to be increased.

In the method for manufacturing the DRAM of the present invention, a further feature is that a part of gate of the active device is formed in the trench of the substrate, where the channel length of the active device can be defined by the trench depth, therefore the channel length of the active device is not limited by a lithography etching process and the device integrity can be advanced. Moreover, the length of the channel region can be precisely controlled by defining the depth of the trench under the active device, hence the problem caused by reducing the device size can be avoided. The above described process relating to fabricate the deep trench capacitor is considered as exemplary only, not as a limitation to the present invention. In other word, in the other embodiments of the present invention, it allows to use other processes to complete the deep trench capacitor, followed by performing the processes relating to fabricate the active device as shown in FIG. 3E~3J, by using which the problem occurred in the prior art that the channel region length is limited by a lithography etching process and the limited channel region length blocks further advancing the device integrity can be resolved. In addition, by using the alternative processes, the problems of the threshold voltage difference of the active device and the problem termed as short-channel effect are expected to be solved as well.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A method for manufacturing a dynamic random access memory (DRAM), comprising:
    providing a substrate, wherein a patterned first mask layer is formed on the substrate, a deep trench is formed in the substrate and the patterned first mask layer exposes the deep trench;
    forming a deep trench capacitor in the deep trench, wherein the deep trench capacitor comprises a lower electrode, an upper electrode and a capacitor dielectric layer;
    forming a device isolation structure in the first mask layer and the substrate for defining an active region;
    removing the first mask layer on the active region for exposing the substrate;
    forming a semiconductor layer on the exposed part of the substrate;
    patterning the semiconductor layer and the substrate for forming a trench, wherein the bottom of the trench is adjacent to the upper electrode of the deep trench capacitor;
    forming a gate structure on the substrate, wherein the gate structure fills the trench; and
    forming a doped region in the substrate at a side of the gate structure.

2. The method for manufacturing a dynamic random access memory (DRAM) as recited in claim 1, wherein the material of the semiconductor layer is epitaxy silicon.

3. The method for manufacturing a dynamic random access memory (DRAM) as recited in claim 1, wherein the steps for forming the deep trench capacitor in the deep trench comprise:
    forming a lower electrode in the substrate at the bottom of the deep trench;
    forming a capacitor dielectric layer on the surface of the deep trench;
    filling the bottom of the deep trench with a first conductive layer;
    removing a part of capacitor dielectric layer uncovered by the first conductive layer;
    forming a collar oxide layer on the sidewall of the deep trench uncovered by the first conductive layer;
    filling the deep trench with a second conductive layer for covering the first conductive layer;
    removing a part of the second conductive layer and the collar oxide layer, so that the surface of the second conductive layer is lower than the substrate surface; and
    filling the deep trench with a third conductive layer, wherein the first conductive layer, the second conductive layer and the third conductive layer form the upper electrode.

4. The method for manufacturing a dynamic random access memory (DRAM) as recited in claim 3, further comprising forming a buried strap in the substrate, wherein the buried strap is adjacent to the third conductive layer and the trench bottom.

5. The method for manufacturing a dynamic random access memory (DRAM) as recited in claim 3, wherein the steps for forming the gate structure on the substrate comprise:
    forming a gate dielectric layer on the substrate;
    forming a conductive layer on the gate dielectric layer, wherein the conductive layer fills the trench; and
    patterning the conductive layer and the gate dielectric layer.

6. The method for manufacturing a dynamic random access memory (DRAM) as recited in claim 5, further comprising forming spacers on the sidewalls of the gate structure.

7. The method for manufacturing a dynamic random access memory (DRAM) as recited in claim 5, further comprising forming a bit line (BL) on the substrate for coupling the doped region.

8. The method for manufacturing a dynamic random access memory (DRAM) as recited in claim 5, wherein the steps for patterning the conductive layer and the gate dielectric layer comprise:
    forming a second mask layer on the substrate to cover a part of the active region;
    removing a part of the semiconductor layer and a part of substrate by using the second mask layer and the device isolation structure as a mask; and
    removing the second mask layer.

* * * * *